United States Patent
Wu et al.

(10) Patent No.: US 8,953,373 B1
(45) Date of Patent: Feb. 10, 2015

(54) FLASH MEMORY READ RETRY USING HISTOGRAMS

(71) Applicant: LSI Corporation, San Jose, CA (US)

(72) Inventors: Yunxiang Wu, Cupertino, CA (US); Erich F. Haratsch, San Jose, CA (US); Yu Cai, San Jose, CA (US); Abdel-Hakim Alhussien, San Jose, CA (US)

(73) Assignee: LSI Corporation, Milpitas, CA (US)

(*) Notice: Subject to any disclaimer, the term of this patent is extended or adjusted under 35 U.S.C. 154(b) by 0 days.

(21) Appl. No.: 14/052,252

(22) Filed: Oct. 11, 2013

Related U.S. Application Data

(60) Provisional application No. 61/886,180, filed on Oct. 3, 2013.

(51) Int. Cl.
*G11C 16/04* (2006.01)
*G11C 16/34* (2006.01)

(52) U.S. Cl.
CPC .................................. *G11C 16/3404* (2013.01)
USPC ............... 365/185.03; 365/185.21; 365/185.2

(58) Field of Classification Search
CPC ............... G11C 16/26; G11C 11/5642; G11C 11/5621; G11C 11/5628; G11C 16/0483; G11C 16/10; G11C 16/28
USPC .......................... 365/185.03, 185.21, 185.2, 365/185.17–185.18, 185.33
See application file for complete search history.

(56) References Cited

U.S. PATENT DOCUMENTS

| | | | |
|---|---|---|---|
| 8,289,781 B2 | 10/2012 | Litsyn et al. | |
| 8,351,258 B1 | 1/2013 | Yang | |
| 8,416,623 B2 | 4/2013 | Yang | |
| 8,531,888 B2 * | 9/2013 | Chilappagari et al. | 365/185.2 |
| 2013/0163328 A1 | 6/2013 | Karakulak et al. | |

* cited by examiner

*Primary Examiner* — David Lam
(74) *Attorney, Agent, or Firm* — Daniel J. Santos; Smith Risley Tempel Santos LLC

(57) ABSTRACT

Upon a read error, a flash memory controller adjusts a candidate reference voltage on successive read retries until either a read error no longer occurs or an optimal reference voltage is attained. Optimal reference voltages correspond to cross-points of flash memory cell voltage distributions. Cross-points can be determined by using different candidate reference voltages to read data from the memory and determining corresponding decision patterns. The frequency of occurrence of the decision patterns in the data read from the memory is used to conceptually construct a histogram. The histogram is used to estimate when a candidate reference voltage has been adjusted to a cross-point.

20 Claims, 15 Drawing Sheets

FLASH MEMORY READ RETRY USING HISTOGRAMS

CROSS-REFERENCE TO RELATED APPLICATION

The benefit of the filing date of U.S. Provisional Patent Application No. 61/886,180, filed Oct. 3, 2013, entitled "FLASH MEMORY READ RETRY USING HISTOGRAMS," is hereby claimed and the specification thereof is incorporated herein in its entirety by this reference.

FIELD OF INVENTION

The invention relates generally to flash memory controllers and, more specifically, to reference voltage optimization upon a read retry in a flash memory controller.

BACKGROUND

A flash memory is a non-volatile electrically erasable data storage device that evolved from electrically erasable programmable read-only memory (EEPROM). The two main types of flash memory are named after the logic gates that their storage cells resemble: NAND and NOR. NAND flash memory is commonly used in solid-state drives, which are supplanting magnetic disk drives in many applications. A NAND flash memory is commonly organized as multiple blocks, with each block organized as multiple pages. Each page comprises multiple cells. Each cell is capable of storing an electric charge. Some cells are used for storing data bits, while other cells are used for storing error-correcting code (ECC) bits. A cell configured to store a single bit is known as a single-level cell (SLC). A cell configured to store two bits is known as a multi-level cell (MLC). In an MLC cell, one bit is commonly referred to as the least-significant bit (LSB), and the other as the most-significant bit (MSB). A cell configured to store three bits is known as a triple-level cell (TLC). Writing data to a flash memory is commonly referred to as "programming" the flash memory, due to the similarity to programming an EEPROM.

The electric charge stored in a cell can be detected in the form of a cell voltage. To read an SLC flash memory cell, the flash memory controller provides one or more reference voltages (also referred to as read voltages) to the flash memory device. Detection circuitry in the flash memory device will interpret the bit as a "0" if the cell voltage is greater than a reference voltage Vref and will interpret the bit as a "1" if the cell voltage is less than the reference voltage Vref. Thus, an SLC flash memory requires a single reference voltage Vref. In contrast, an MLC flash memory requires three such reference voltages, and a TLC flash memory requires seven such reference voltages. Thus, reading data from an MLC or TLC flash memory device requires that the controller provide multiple reference voltages having optimal values that allow the memory device to correctly detect the stored data values.

Determining or detecting stored data values using controller-provided reference voltages is hampered by undesirable physical non-uniformity across cells of a device that are inevitably introduced by the fabrication process, as such non-uniformity results in the reference voltages of different cells that store the same bit value being significantly different from each other. The detection is further hampered by reference voltages changing over time due to adverse effects of changes in temperature, interference from programming neighboring cells, and numerous erase-program cycles. Errors in detecting stored data values are reflected in the performance measurement known as bit error rate (BER). The use of ECC can improve BER to some extent, but the effectiveness of ECC diminishes as improved fabrication processes result in smaller cell features.

Conventional methods for aiding the detection of stored data values using reference voltages commonly rely upon an assumption that the reference voltage windows for a device have Gaussian distributions. As illustrated in FIG. 1, an MLC flash memory has four cell voltage distributions 102, 104, 106 and 108 with four respective mean target cell voltages Vtarget0 112, Vtarget1 114, Vtarget2 116 and Vtarget3 118. Such cell voltage distributions commonly overlap each other slightly, but such overlap is not shown in FIG. 1 for purposes of clarity. During a read operation, to attempt to characterize or detect the two bits of cell data (i.e., the LSB and MSB) a flash memory device (not shown) uses three reference voltages it receives from a flash memory controller (not shown): Vref0 122, Vref1 124 and Vref2 126. More specifically, the flash memory device compares the cell voltage with Vref1 124 to attempt to detect the LSB. If the flash memory device determines that the cell voltage is less than Vref1 124, i.e., within a window 128, then the flash memory device characterizes the LSB as a "1". If the flash memory device determines that the cell voltage is greater than Vref1 124, i.e., within a window 130, then the flash memory device characterizes the LSB as a "0". The flash memory device also compares the cell voltage with Vref0 122 and Vref2 126 to attempt to detect the MSB. If the flash memory device determines that the cell voltage is between Vref0 122 and Vref2 126, i.e., within a window 132, then the flash memory device characterizes the MSB as a "0". If the flash memory device determines that the cell voltage is either less than Vref0 122 or greater than Vref2 126, i.e., within a window 134, then the flash memory device characterizes the MSB as a "1".

Despite the benefits of conventional methods for aiding the detection of stored data values, such as the use of ECC, a page read sometimes fails. That is, the BER is so great that ECC decoding is unable to correct all erroneous bits. A common method for responding to such a page read failure is known as a "retry" or "read retry." Although various read retry methods are known, a common characteristic among them is that they adjust the candidate reference voltage by incrementing or decrementing it by a fixed amount ($\Delta V$) and then try to read the page a second time using the adjusted candidate reference voltage. If there is a second page read failure, the methods again adjust the candidate reference voltage by incrementing or decrementing it and try to read the page a third time using the adjusted reference voltage. The manner in which the methods adjust the candidate reference voltage generally follows a straightforward pattern. For example, on the first retry after a page read failure a method can increment the original reference voltage Vref to a value Vref+$\Delta V$. If there is a second page read failure, then on the second retry the method can decrement the original reference voltage Vref to a value Vref−$\Delta V$. If there is a third page read failure, then on the third retry the method can increment the original reference voltage Vref to a value Vref+2$\Delta V$. If there is a fourth page read failure, then on the fourth retry the method can decrement the original reference voltage Vref to a value Vref−2$\Delta V$. Such a pattern can continue in this manner, with the method adjusting the candidate reference voltage to successively more positive values alternating with successively more negative values. In other words, the method searches for a reference voltage that results in a successful page read by broadening the search outwardly from a midpoint defined by the reference voltage used on the initial page read that failed.

Such conventional read retry methods that blindly search for a reference voltage that results in a successful page read can be slow and therefore adversely impact memory throughput. Such methods can severely impact memory throughput in a system having TLC flash memory because the upper page read uses four reference voltages, causing an exponential increase in read retry time. It would be desirable to enable a flash memory controller to determine an optimal reference voltage by performing a minimal number of read retries.

SUMMARY

Embodiments of the invention relate to a flash memory controller and method in which successive read retries adjust the candidate reference voltage closer to an optimal reference voltage. In accordance with an exemplary embodiment of the invention, a method of operation in a flash memory controller includes: reading data from a portion of a flash memory using a candidate reference voltage; determining whether a read error occurred; determining a plurality of decision patterns if it is determined a read error occurred, each decision pattern corresponding to a voltage region bordering the candidate reference voltage; counting occurrences of each decision pattern of the plurality of decision patterns in the data read from the portion of the flash memory; determining a new candidate reference voltage in response to frequency of the occurrences of each decision pattern; and repeating the step of reading data from a portion of a flash memory using the new candidate reference voltage.

Also in accordance with the exemplary embodiment, a flash memory controller includes a buffer memory and a processing system. The processing system includes: read logic for reading data from a portion of a flash memory using a candidate reference voltage; read retry logic for determining whether a read error occurred; decision pattern logic for determining a plurality of decision patterns if it is determined a read error occurred, each decision pattern corresponding to a voltage region bordering the candidate reference voltage; histogram logic for counting occurrences of each decision pattern of the plurality of decision patterns in the data read from the portion of the flash memory; reference voltage adjustment logic for determining a new candidate reference voltage in response to frequency of the occurrences of each decision pattern; and detection logic for using the new candidate reference voltage in again reading data from a portion of a flash memory.

WRITTEN DESCRIPTION

Figure 1:
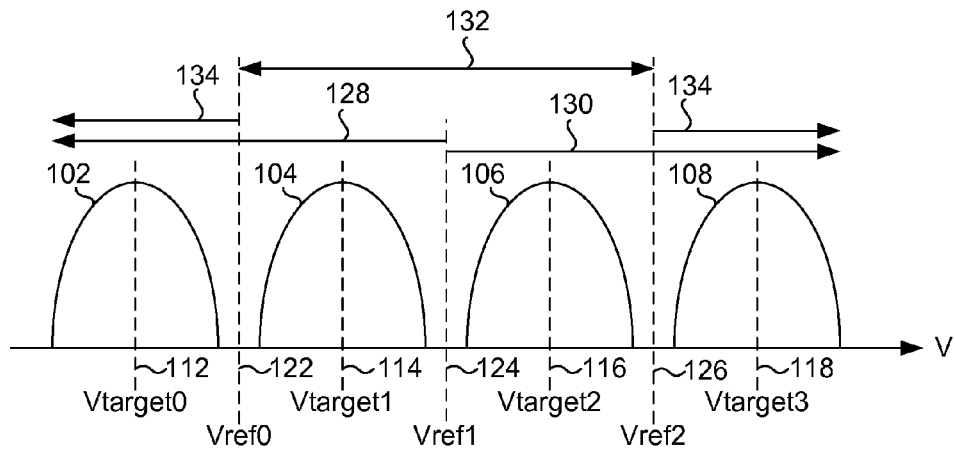
FIG. 1 is a plot of cell voltage distributions in a flash memory, as known in the art.
Figure 2:
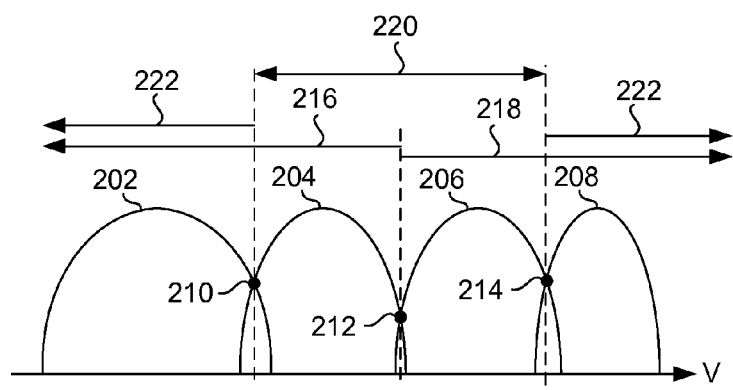
FIG. 2 is a plot of flash memory cell voltage distributions, showing the cross-points between them.

As illustrated in FIG. 2, in an illustrative or exemplary embodiment of the invention, MLC NAND flash memory cell voltage distributions 202, 204, 206 and 208 are characterized by cross-points 210, 212 and 214. Cross-point 210 represents a voltage where voltage distributions 202 and 204 cross or overlap each other. Cross-point 212 represents a voltage where cell voltage distributions 204 and 206 cross or overlap each other. Cross-point 214 represents a voltage where cell voltage distributions 206 and 208 cross or overlap each other. (Note that FIG. 2 is not to scale, and the extent of the overlap is highly exaggerated for emphasis.) Cross-point 212 can be used to determine voltage windows 216 and 218, which relate to detection of the LSB stored in the cell. Cross-points 210 and 214 can be used to determine voltage windows 220 and 222, which relate to detection of the MSB stored in the cell. Cross-points 210, 212 and 214 thus can be used to aid detection of the data stored in the cells or "read data" as it may be referred to. The inability to detect read data is referred to herein as a read error or failure. The method described below relates to, upon occurrence of a read error, retrying the read operation after adjusting the candidate reference voltage closer to the relevant cross-point. One or more such read retries may be performed until either a read error no longer occurs or until the candidate reference voltage essentially cannot be adjusted any closer to the relevant cross-point or optimal reference voltage.

Figure 3:
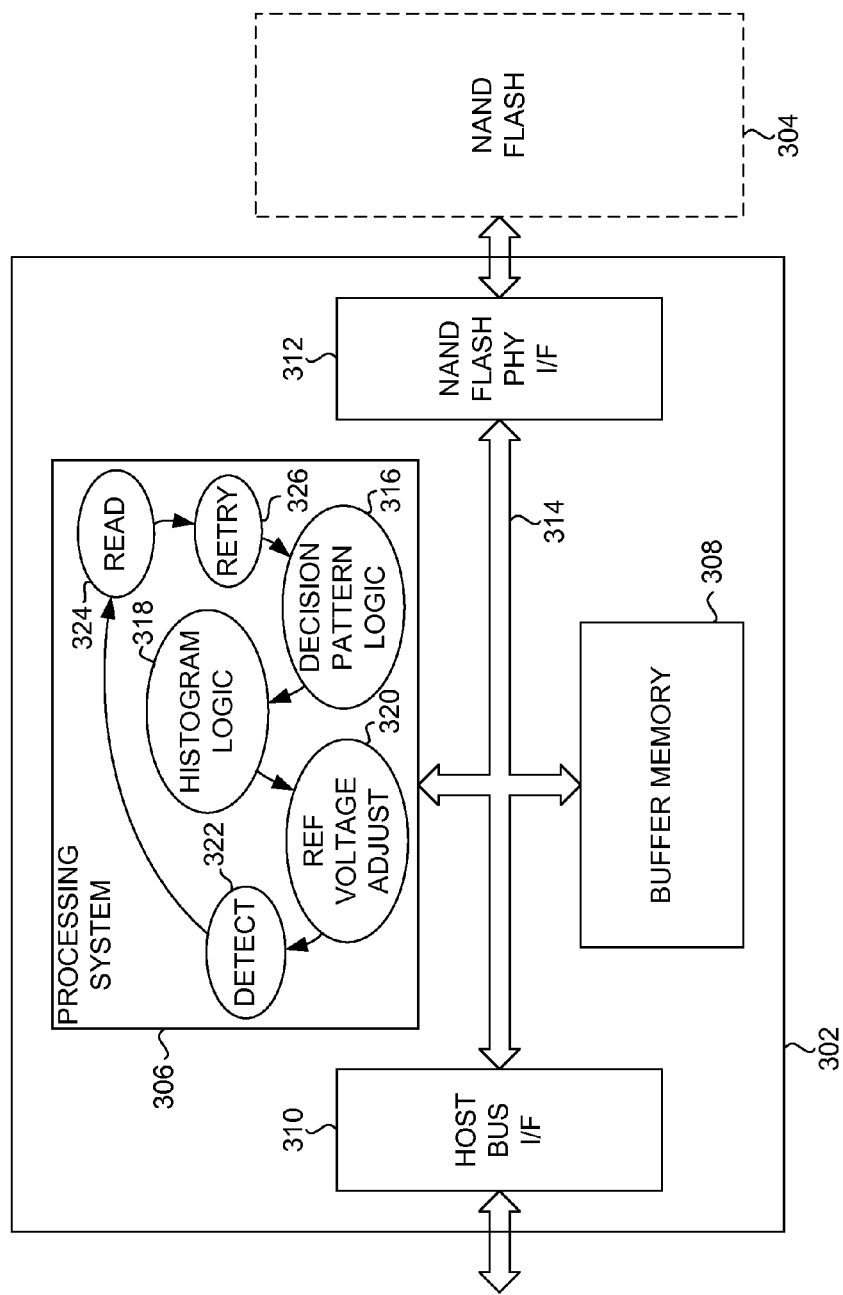
FIG. 3 is a block diagram of a flash memory controller, in accordance with an exemplary embodiment of the invention.

As illustrated in FIG. 3, in the exemplary embodiment a flash memory controller 302 can adjust the candidate reference voltage(s) closer to cross-points 210, 212 and 214 (FIG.

2) in an MLC NAND flash memory device 304 and use this information to aid detection of read data during a read retry. In other embodiments (not shown), such a flash memory controller can adjust the candidate reference voltage(s) closer to similar cross-points in other types of flash memory devices. Although only one flash memory device 304 is shown for purposes of clarity, flash memory controller 302 can control multiple flash memory devices. Flash memory controller 302 includes a processing system 306, a buffer memory 308, a host bus interface 310, and a NAND flash physical interface 312. Flash memory controller 302 can include additional elements, such as those that are commonly included in conventional flash memory controllers, but such other elements are not shown for purposes of clarity. The foregoing elements are interconnected by a data bus 314. Host bus interface 310 is used to interface flash memory controller 302 to an external system (not shown), such as a computer. Host bus interface 310 can be of any suitable conventional type. As such a host bus interface 310 is well understood by persons skilled in the art, it is not described herein in further detail. NAND flash physical interface 312 is used in the exemplary embodiment to interface flash memory controller 302 to MLC NAND flash memory device 304 and can be of any suitable conventional type. As such a NAND flash physical interface 312 is well understood by persons skilled in the art, it is not described herein in further detail. Buffer memory 308 is used to temporarily store data that is read from MLC NAND flash memory device 304 and can be of any suitable conventional type, such as static random access memory.

Although not shown for purposes of clarity, processing system 306 can comprise one or more suitable processors, such as central processing units, digital signal processors or other specialized processors, etc., and suitable memory from which such processors execute instructions. Processing system 306 can comprise any suitable combination of hardware, software, firmware, etc. Conceptually shown for illustrative purposes as residing in processing system 306 are a number of logic elements: decision pattern logic 316, histogram logic 318, reference voltage adjustment logic 320, and read data detection logic 322. Also included is read logic 324 for generally coordinating the reading of data from MLC NAND flash memory device 304 in response to requests received via host bus interface 310. In addition, retry logic 326 is included. Retry logic 326 is for determining whether a read error occurred, such that a read retry is warranted. Such logic elements can be defined by hardware logic, by execution of software or firmware (instructions) by a processor, or by any other suitable means. Such logic elements configure processing system 306 to effect the method described below. Other logic elements with which processing system 306 may be configured but which are not shown for purposes of clarity include error-correcting code (ECC) logic, wear leveling logic, and other logic of the types commonly included in flash memory controllers.

Figure 4:
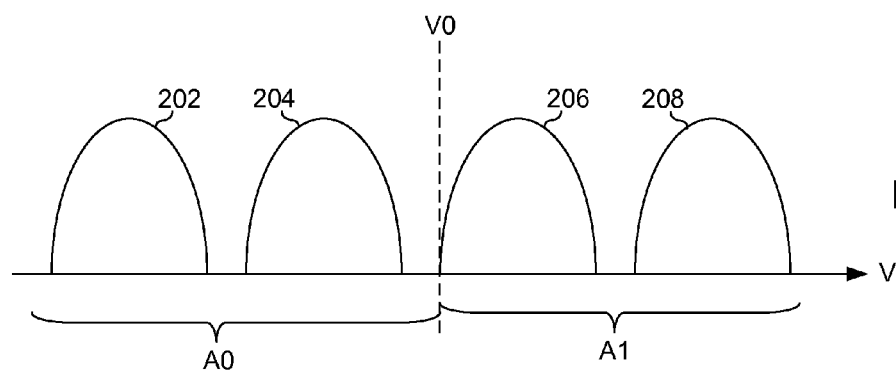
FIG. 4 is a plot of flash memory cell voltage distributions showing an example in which one candidate reference voltage is used.

The method described below relates to performing one or more read retries in which, on each successive read retry, it is attempted to adjust a candidate reference voltage closer to the relevant cross-point that defines an optimal reference voltage. Referring briefly again to FIG. 2, it can be noted that voltage windows 216 and 218 and thus cross-point 212 serve as the criteria for detecting the LSB of the read data that is read from a cell. With further reference to an example shown in FIG. 4, similar voltage ranges or decision regions A0 and A1 and thus cross-point 212 (not shown in FIG. 4 because the method has not yet determined its location) serve as the criteria for detecting the LSB. If a single candidate reference voltage V0 is used to read a single cell, the read data (LSB) is characterized as a "1" if the cell voltage is less than V0, i.e., in the voltage range or decision region A0, and characterized as a "0" if the cell voltage is greater than V0, i.e., in the voltage range or decision region A1. Thus, for the ordered set of decision regions {A0, A1} there is an ordered set of corresponding decision patterns {1, 0}.

Figure 5:
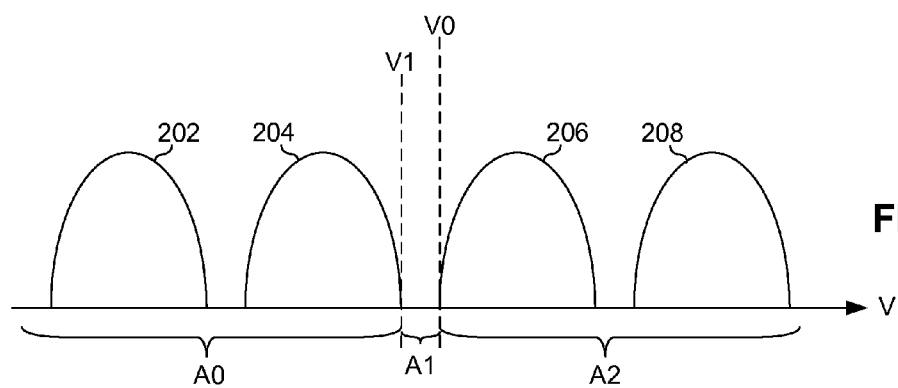
FIG. 5 is a plot of flash memory cell voltage distributions showing an example in which two candidate reference voltages are used.

In another example, shown in FIG. 5, voltage ranges or decision regions A0, A1 and A2, which similarly relate to cross-point 212 (not shown in FIG. 5 because the method has not yet determined its location) serve as further criteria for detecting the LSB. A first candidate reference voltage V0 is used to read a cell, and a second candidate reference voltage V1 that is incrementally less than V0 is used to read the same cell. If the cell voltage is less than V1, i.e., in the voltage range or decision region A0, then the read data (LSB) that is produced in response to the use of the second candidate reference voltage V1 is characterized as a "1", and the read data (LSB) that is produced in response to the use of the first candidate reference voltage V0 is characterized as a "1". If the cell voltage is between V0 and V1, i.e., in the voltage range or decision region A1, then the read data (LSB) that is produced in response to the use of the first candidate reference voltage V0 is characterized as a "0", and the read data (LSB) that is produced in response to the use of the second candidate reference voltage V1 is characterized as a "1". If the cell voltage is greater than V0, i.e., in the voltage range or decision region A2, then the read data (LSB) that is produced in response to the use of the second candidate reference voltage V1 is characterized as a "0", and the read data (LSB) that is produced in response to the use of the first candidate reference voltage V0 is characterized as a "0". Thus, for the ordered set of decision regions {A0, A1, A2} there is an ordered set of three corresponding two-bit decision patterns {11, 01, 00}. The left bit in each two-bit decision pattern corresponds to the use of the first candidate reference voltage V0, and the right bit in each two-bit decision pattern corresponds to the use of the second candidate reference voltage V1.

Figure 6:
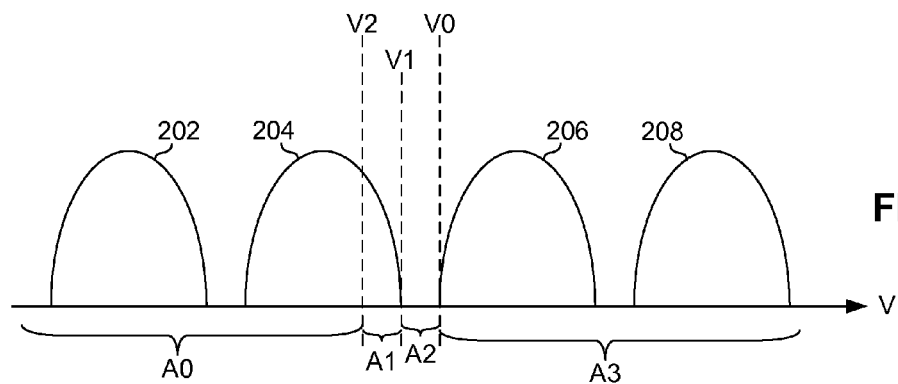
FIG. 6 is a plot of flash memory cell voltage distributions showing an example in which three candidate reference voltages are used.

In still another example, shown in FIG. 6, voltage windows A0, A1, A2 and A3, which similarly relate to cross-point 212 (not shown in FIG. 6 because the method has not yet determined its location) serve as further criteria for detecting the LSB. A first candidate reference voltage V0 is used to read a cell, a second candidate reference voltage V1 that is incrementally less than V0 is used to read the same cell, and a third candidate reference voltage V2 that is incrementally less than V1 is also used to read the same cell. If the cell voltage is less than V2, i.e., in the voltage range or decision region A0, then the read data (LSB) that is produced in response to the use of the third candidate reference voltage V2 is characterized as a "1", the read data (LSB) that is produced in response to the use of the second candidate reference voltage V1 is characterized as a "1", and the read data (LSB) that is produced in response to the use of the first candidate reference voltage V0 is characterized as a "1". If the cell voltage is between V2 and V1, i.e., in the voltage range or decision region A1, then the read data (LSB) that is produced in response to the use of the third candidate reference voltage V2 is characterized as a "0", the read data (LSB) that is produced in response to the use of the second candidate reference voltage V1 is characterized as a "1", and the read data (LSB) that is produced in response to the use of the first candidate reference voltage V0 is characterized as a "1". If the cell voltage is between V1 and V0, i.e., in the voltage range or decision region A2, then the read data (LSB) that is produced in response to the use of the third candidate reference voltage V2 is characterized as a "0", the read data (LSB) that is produced in response to the use of the second candidate reference voltage V1 is characterized as a "0", and the read data (LSB) that is produced in response to the use of the first candidate reference voltage V0 is characterized as a "1". If the cell voltage is greater than V0, i.e., in the voltage range or decision region A3, then the read data (LSB) that is produced in response to the use of the third candidate reference voltage V2 is characterized as a "0", the read data (LSB) that is produced in response to the use of the second candidate reference voltage V1 is characterized as a "0", and the read data (LSB) that is produced in response to the use of the first candidate reference voltage V0 is characterized as a "0". Thus, for the ordered set of decision regions {A0, A1, A2, A3} there is an ordered set of four corresponding three-bit decision patterns {111, 011, 001, 000}. The leftmost bit in each three-bit decision pattern corresponds to the use of the first candidate reference voltage V0, the middle bit in each three-bit decision pattern corresponds to the use of the second candidate reference voltage V1, and the rightmost bit in each three-bit decision pattern corresponds to the use of the third candidate reference voltage V2.

Figure 7:
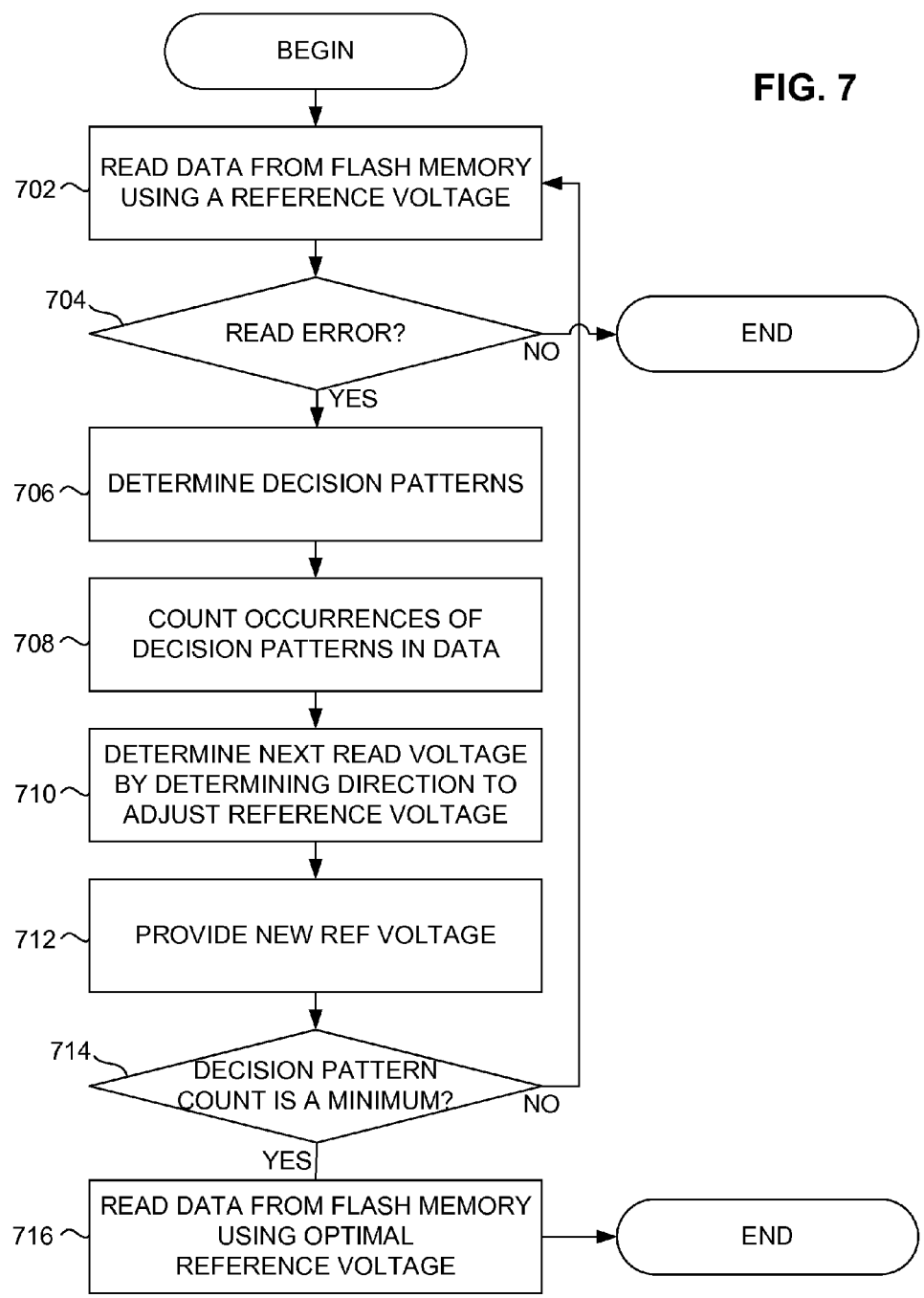
FIG. 7 is a flow diagram illustrating an exemplary method of operation of the flash memory controller of FIG. 3, in accordance with the exemplary embodiment.

As illustrated in FIG. 7, a method of operation is represented by a flow diagram comprising blocks 702, 704, 706, 708, 710, 712, 714 and 716. As indicated by block 702, flash memory controller 302 reads data from MLC NAND flash memory device 304 (FIG. 3) using a candidate reference voltage. As described below in further detail, block 702 can relate to an initial read operation performed in response to a read request received from a host device (not shown) via host bus interface 310, or it can relate to a read retry if a read error occurred on an initial read operation. Flash memory controller 302 can temporarily store this read data obtained from MLC NAND flash memory device 304 in buffer memory 308. Read logic 324 (FIG. 3) can contribute to the configuration of processing system 306 to effect these aspects of the method.

As indicated by block 704, flash memory controller 302 determines whether a read error occurred. As well understood in the art, a read error occurs if the ECC bits indicate an error that cannot be corrected. If it is determined (block 704) that no read error occurred, then the method ends, and flash memory controller 302 can continue operating in a conventional manner, such as writing or reading data to or from MLC NAND flash memory device 304. If it is determined (block 704) that a read error occurred, then the method continues as indicated by blocks 706-714, which relate to a read retry. Read retry logic 326 (FIG. 3) can contribute to the configuration of processing system 306 to effect these aspects of the method.

As indicated by block 706, based on the candidate reference voltage, flash memory controller 302 determines or generates one or more decision patterns of the type described above with regard to FIGS. 4-6. As described above, at least one decision pattern corresponds to a voltage region bordering the candidate reference voltage. Note that as the method proceeds through successive candidate reference voltages, each decision pattern that is generated corresponds to a voltage region bordering one of the candidate reference voltages. Decision pattern logic 316 (FIG. 3) can contribute to the configuration of processing system 306 to effect these aspects of the method.

As indicated by block 708, flash memory controller 302 counts the number of times each decision pattern occurs in the read data that has been stored in buffer memory 308. Histogram logic 318 (FIG. 3) can contribute to the configuration of processing system 306 to effect these aspects of the method. An example described below relates the number of times each decision pattern occurs, i.e., the frequency of occurrence of each decision pattern, to bars of a histogram.

As indicated by block 710, flash memory controller 302 determines a new candidate reference voltage or next candidate reference voltage in response to the frequency of the occurrence of each decision pattern. As described below in further detail with regard to FIGS. 8A-9F, to define the new candidate reference voltage, the candidate reference voltage that was used (block 702) to read MLC NAND flash memory device 304 is either incremented or decremented. As indicated by block 712, flash memory controller 302 can maintain the new candidate reference voltage (e.g., provide the new candidate reference voltage to read logic 324) in preparation for use in a read retry or next read operation.

As indicated by block 714, flash memory controller 302 determines whether any of the decision pattern counts is a minimum. A minimal decision pattern count indicates that a candidate reference voltage has been found that essentially cannot be adjusted any closer to the relevant reference voltage or cross-point. As described below in further detail with regard to FIGS. 8A-9F, a minimal decision pattern count (which can be represented by a histogram bar) among the decision pattern counts that have been generated is indicative of a best estimate of the optimal reference voltage. As described below, flash memory controller 302 determines whether the decision pattern count is a minimum by determining whether a change in the sign of a histogram slope has occurred.

If it is determined (block 714) that one (or more) of the decision pattern counts is a minimum, then flash memory controller 302 reads data from MLC NAND flash memory device 304 (FIG. 3) using the new candidate reference voltage, as indicated by block 716, and the method ends. If it is determined (block 714) that none of the decision pattern counts is a minimum, then the method continues as described above with regard to block 702. That is, flash memory controller 302 can perform a read retry using the new candidate reference voltage in an attempt to more correctly detect the data stored in MLC NAND flash memory device 304. Detection logic 322 (FIG. 3) can contribute to the configuration of processing system 306 to effect these aspects of the method. Successive retries continue until either a successful read (i.e., no error) occurs or a read uses the optimal candidate reference voltage.

The above-described method is represented in further detail by the flow diagram of FIGS. 8A-D. As indicated by block 802, flash memory controller 302 reads data from MLC NAND flash memory device 304 using an initial (first) candidate reference voltage, in response to, for example, a read request received from a host device (not shown) via host bus interface 310. Flash memory controller 302 determines whether a read error occurred, as indicated by blocks 804, 806 and 808, and the method proceeds in accordance with whether the read error occurred on the initial (first) read, on a first retry (second read), or on a subsequent retry (third, fourth, fifth, etc. read). If it is determined in accordance with blocks 804-808 that no read error occurred, then the method ends, and flash memory controller 302 can continue operating in a conventional manner, such as reading or writing data to or from MLC NAND flash memory device 304 in response to further read requests.

Figure 8A:
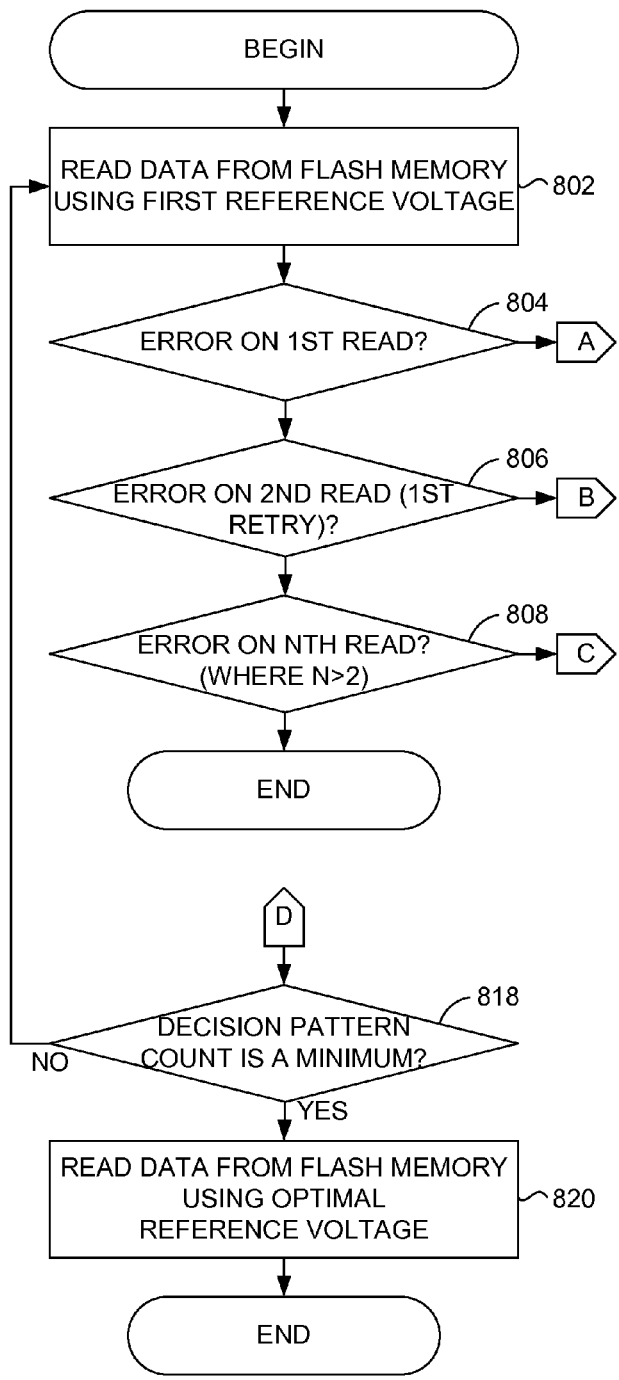
FIG. 8A is a flow diagram illustrating the exemplary method of operation in further detail.
Figure 8B:
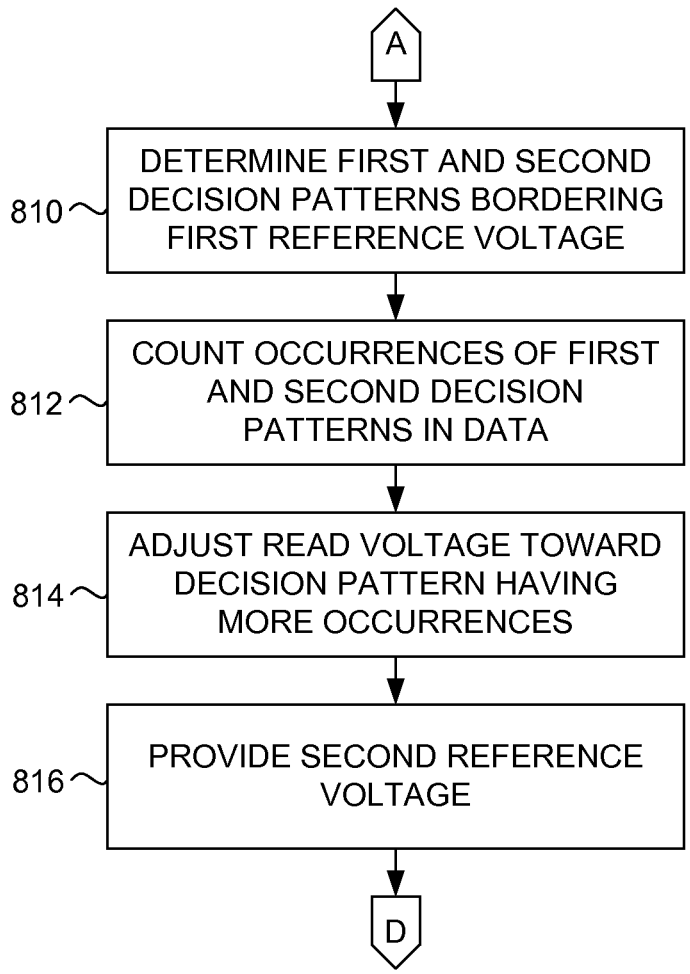
FIG. 8B is a continuation of the flow diagram of FIG. 8A.
Figure 9A:
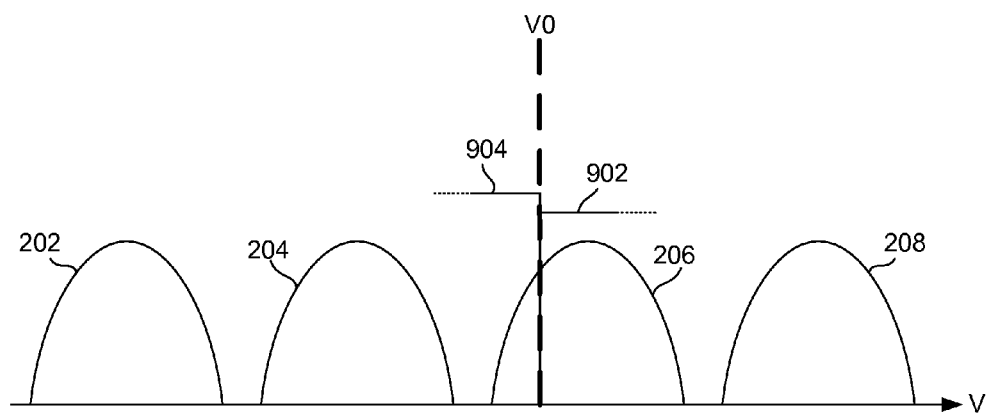
FIG. 9A is a plot of exemplary flash memory reference voltage distributions, showing a first exemplary candidate reference voltage and two open histogram bars used in relation to determining a cell voltage distribution cross-point associated with an LSB of a memory cell.

If it is determined (block 804) that a read error occurred on the initial (first) read, then flash memory controller 302 determines first and second decision patterns corresponding to voltage regions bordering the first candidate reference voltage, as indicated by block 810 (FIG. 8B). Referring briefly to FIG. 9A, an example of a first candidate reference voltage V0 is shown in relation to reference voltage distributions 202-208 of MLC NAND flash memory device 304. The decision regions or voltage regions are not labeled as such in FIG. 9A for purposes of clarity but are the same in principle as those described above with regard to FIGS. 4-6 (e.g., labeled A0, A1, A2, A3, etc.). However, note in FIG. 9A that the first and second decision regions (and thus the first and second decision patterns) conceptually correspond to the width dimensions of two histogram bars 902 and 904, respectively. Histogram bars 902 and 904 are referred to as "open" (or infinite width) because they represent the frequency of occurrence of decision patterns corresponding to the open-ended voltage regions to the left of the first candidate reference voltage V0 and to the right of the first candidate reference voltage V0, respectively.

As indicated by block 812, flash memory controller 302 counts the number of occurrences of each of the first and second decision patterns in the data that was read (block 802) from MLC NAND flash memory device 304 (referred to herein for brevity as the read data). These counts correspond to the lengths or heights of histogram bars 902 and 904. The longer or higher histogram bar 904 represents a decision pattern having more occurrences than the decision pattern represented by the shorter or lower histogram bar 902. In the illustrated example, histogram bar 902 represents the count of the number of times the decision pattern corresponding to the voltage region greater than V0 occurs in the read data, and histogram bar 904 represents the count of the number of times the decision pattern corresponding to the voltage region less than V0 occurs in the read data.

Figure 9B:
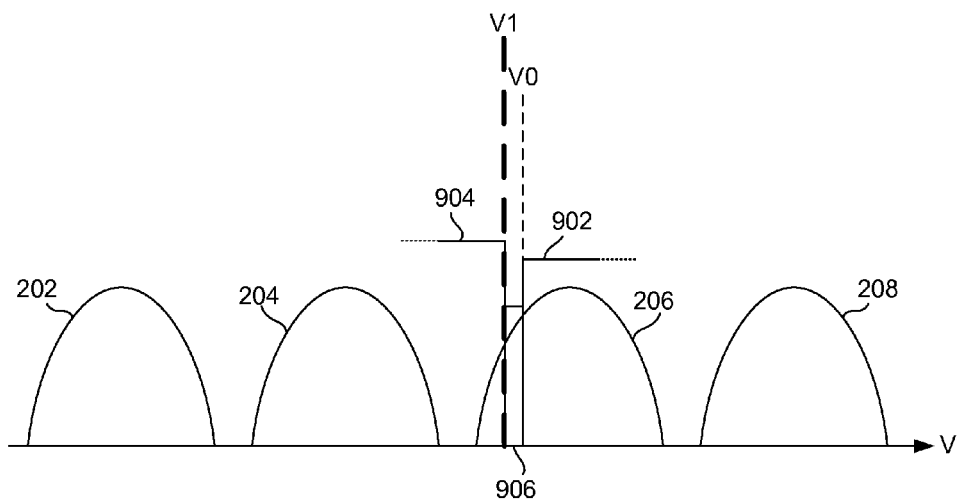
FIG. 9B is similar to FIG. 9A, further showing a second exemplary candidate reference voltage, two open histogram bars, and one closed histogram bar.

As indicated by block 814, flash memory controller 302 determines a new (second) candidate reference voltage V1 by adjusting the initial (first) candidate reference voltage V0. In an instance in which it is determined (block 804) that a read error occurred on the initial (first) read, flash memory controller 302 adjusts the candidate reference voltage in the direction toward the higher of the two open histogram bars 902 and 904. Accordingly, in an instance in which the higher histogram bar is to the left of V0 (i.e., corresponds to a voltage region less than V0), then flash memory controller 302 decrements the first candidate reference voltage V0. Thus, in such an instance the resulting second candidate reference voltage V1 will be incrementally lower than the first candidate reference voltage V0. Similarly, in an instance in which the higher histogram bar is to the right of V0 (i.e., corresponds to a voltage region greater than V0), then flash memory controller 302 increments the first candidate reference voltage V0. Thus, in such an instance the resulting second candidate reference voltage V1 will be incrementally higher than the first candidate reference voltage V0. In the example shown in FIG. 9, because the second histogram bar 904 is higher than the first histogram bar 902 (i.e., the second decision pattern has more occurrences than the first decision pattern), the second candidate reference voltage V1 will be incrementally lower than the first candidate reference voltage, as shown in FIG. 9B.

As indicated by block 816, flash memory controller 302 can maintain the new (second) candidate reference voltage V1 for use in detecting data during a subsequent read. The method continues as indicated by block 818 (FIG. 8A), where flash memory controller 302 determines whether one (or more) of the decision pattern counts is a minimum. As described above, the presence of a minimum indicates that one of the candidate reference voltages is optimal or as close as possible to the relevant reference voltage or cross-point. In the example illustrated in FIG. 9, the second candidate reference voltage V1 is not optimal. If it were determined (block 818) that one of the candidate reference voltages is optimal, then flash memory controller 302 would read data from MLC NAND flash memory device 304 using the optimal candidate reference voltage, as indicated by block 820, and the method would end, since in such an instance the method cannot adjust the candidate reference voltage any closer to the relevant reference voltage. If it is determined (block 818) that a minimal decision pattern count has not yet occurred, then the method continues as described above with regard to block 802. That is, flash memory controller 302 can perform a read retry using the second candidate reference voltage V1.

Following a read error on the first read, a second read (or first retry) can be performed in accordance with block 802. Flash memory controller 302 can then determine whether a read error occurred on the second read, as indicated by block 806.

Figure 8C:
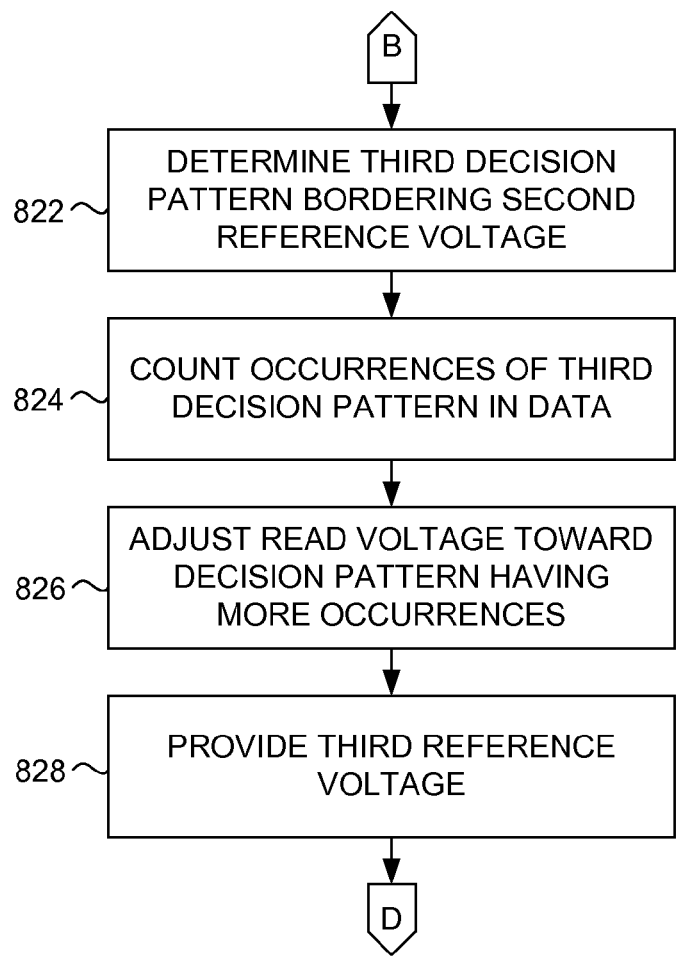
FIG. 8C is a continuation of the flow diagram of FIGS. 8A-B.

If it is determined (block 806) that a read error occurred on the second read, then flash memory controller 302 determines a third decision pattern V2 corresponding to a voltage region bordering the second candidate reference voltage V1, as indicated by block 822 (FIG. 8C). Referring briefly to FIG. 9B, an example of first and second candidate reference voltages V0 and V1 are shown in relation to reference voltage distributions 202-208 of MLC NAND flash memory device 304. The decision regions or voltage regions are not labeled as such in FIG. 9B for purposes of clarity but are the same in principle as those described above with regard to FIGS. 4-6 (e.g., labeled A0, A1, A2, A3, etc.). However, note in FIG. 9B that the first, second and third decision regions (and thus the first, second and third decision patterns) conceptually correspond to the width dimensions of three histogram bars 902, 904 and 906, respectively. In contrast with the "open" first and second histogram bars 902 and 904, third histogram bar 906 can be referred to as "closed" (or finite width) because it represents the frequency of occurrence of a decision pattern corresponding to a voltage region between V0 and V1.

As indicated by block 824, flash memory controller 302 counts the number of occurrences of each of the third decision pattern in the read data. This count corresponds to the length of third histogram bar 906. That is, third histogram bar 906 represents the count of the number of times the decision pattern corresponding to the voltage region between V0 and V1 occurs in the read data.

Figure 9C:
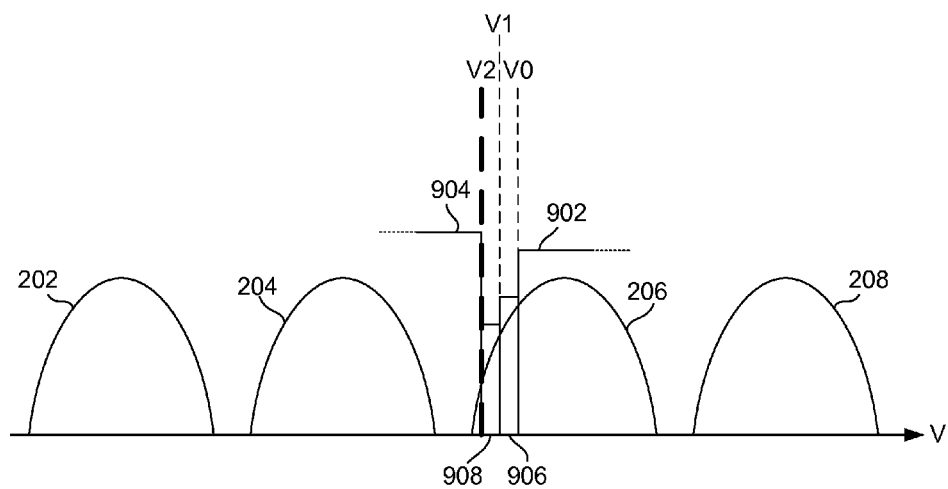
FIG. 9C is similar to FIG. 9B, further showing a third exemplary candidate reference voltage, two open histogram bars, and two closed histogram bars.

As indicated by block 826, flash memory controller 302 determines a new (third) candidate reference voltage V2 by adjusting the second candidate reference voltage V1. In an instance in which it is determined (block 806) that a read error occurred on the second read (first retry), flash memory controller 302 again adjusts the candidate reference voltage in the direction toward the higher of the two open histogram bars 902 and 904. Accordingly, in an instance in which the higher histogram bar is to the left of the second candidate reference voltage V1 (i.e., corresponds to a voltage region less than V1), then flash memory controller 302 decrements the second candidate reference voltage V1. Thus, in such an instance the resulting third candidate reference voltage V2 will be incrementally lower than the second candidate reference voltage V1. Similarly, in an instance in which the higher histogram bar is to the right of the second candidate reference voltage V1 (i.e., corresponds to a voltage region greater than V1), then flash memory controller 302 increments the second candidate reference voltage V1. Thus, in such an instance the resulting third candidate reference voltage V2 will be incrementally higher than the second candidate reference voltage V1. In the example shown in FIG. 9B, because the second histogram bar 904 is higher than the first histogram bar 902 (i.e., the second decision pattern has more occurrences than the first decision pattern), the third candidate reference voltage V2 will be incrementally lower than the second candidate reference voltage V1, as shown in FIG. 9C.

As indicated by block 828, flash memory controller 302 can maintain the new (third) candidate reference voltage V2 for use in detecting data during a subsequent read. The method continues as indicated by block 818 (FIG. 8A), where flash memory controller 302 determines whether one (or more) of the decision pattern counts is a minimum. As described above, the presence of a minimum indicates that one of the candidate reference voltages is optimal or as close as possible to the relevant reference voltage or cross-point. In the example illustrated in FIG. 9, the third candidate reference voltage V2 is not optimal. If it were determined (block 818) that one of the candidate reference voltages is optimal, then flash memory controller 302 would read data from MLC NAND flash memory device 304 using the optimal candidate reference voltage, as indicated by block 820, and the method would end, since in such an instance the method cannot adjust the candidate reference voltage any closer to the relevant reference voltage. If it is determined (block 818) that a minimal decision pattern count has not yet occurred, then the method continues as described above with regard to block 802. That is, flash memory controller 302 can perform a read retry using the third candidate reference voltage V2.

Following a read error on the second read, third read, fourth read, etc., yet another read retry can be performed in accordance with block 802. Stated generally, if an error occurs on the "nth" read using an nth candidate reference voltage, an "(n+1)th" read can be performed using an (n+1)th candidate reference voltage. Flash memory controller 302 can determine whether a read error occurred on the nth read (where n>2), as indicated by block 808.

Figure 8D:
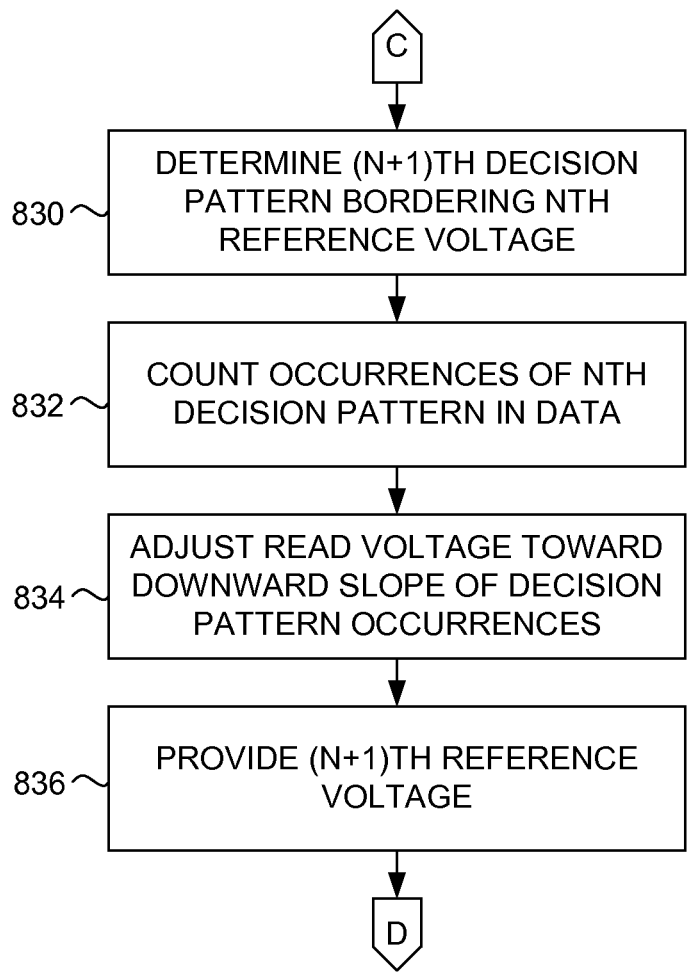
FIG. 8D is a continuation of the flow diagram of FIG. 8A-C.

If it is determined (block 808) that a read error occurred on the nth read (where n>2), then flash memory controller 302 determines an (n+1)th decision pattern corresponding to a voltage region bordering the nth candidate reference voltage, as indicated by block 830 (FIG. 8D). Referring briefly to FIG. 9C, an example of first, second and third candidate reference voltages V0, V1 and V2, respectively, are shown in relation to reference voltage distributions 202-208 of MLC NAND flash memory device 304. The decision regions or voltage regions are not labeled as such in FIG. 9C for purposes of clarity but are the same in principle as those described above with regard to FIGS. 4-6 (e.g., labeled A0, A1, A2, A3, etc.). However, note in FIG. 9C that the first, second, third and fourth decision regions (and thus the first, second, third and fourth decision patterns) conceptually correspond to the width dimensions of four histogram bars 902, 904, 906 and 908, respectively. The fourth histogram bar 908 is closed because it represents the frequency of occurrence of a decision pattern corresponding to a voltage region between V1 and V2.

As indicated by block 832, flash memory controller 302 counts the number of occurrences of the (n+1)th decision pattern in the read data. In the example shown in FIG. 9C, the fourth histogram bar 908 represents the count of the number of times the decision pattern corresponding to the voltage region between V1 and V2 occurs in the read data.

Figure 9D:
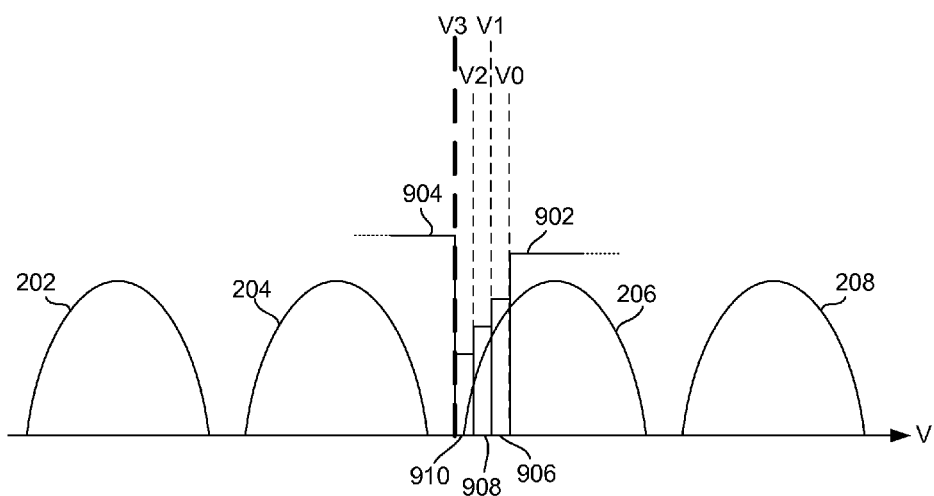
FIG. 9D is similar to FIG. 9C, further showing a fourth exemplary candidate reference voltage, two open histogram bars, and three closed histogram bars.
Figure 9E:
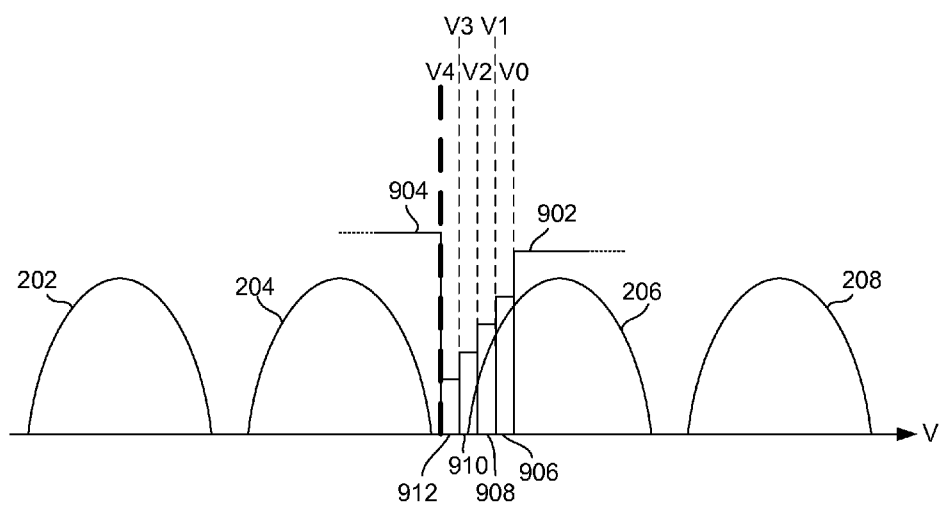
FIG. 9E is similar to FIG. 9D, further showing a fifth exemplary candidate reference voltage, two open histogram bars, and four closed histogram bars.

Block 834 is different from above-described blocks 814 and 826 because block 834 only applies after, conceptually speaking, at least two closed histogram bars have been created (i.e., when n is greater than 2). As indicated by block 834, flash memory controller 302 determines a new (n+1)th candidate reference voltage by adjusting the nth candidate reference voltage. In an instance in which it is determined (block 808) that a read error occurred on the nth read (where n>2), flash memory controller 302 adjusts the candidate reference voltage in the direction of the downward slope of the two closed histogram bars adjacent the nth candidate reference voltage (i.e., the nth and (n+1)th histogram bars). Accordingly, in an instance in which the lower of the nth and (n+1)th histogram bars is to the left of the higher of the nth and (n+1)th histogram bars, then flash memory controller 302 decrements the nth candidate reference voltage. Thus, in such an instance the resulting (n+1)th candidate reference voltage will be incrementally lower than the nth candidate reference voltage. Similarly, in an instance in which the lower of the nth and (n+1)th histogram bars is to the right of the higher of the nth and (n+1)th histogram bars, then flash memory controller 302 increments the nth candidate reference voltage. Thus, in such an instance the resulting (n+1)th candidate reference voltage will be incrementally higher than the nth candidate reference voltage. In the example shown in FIG. 9C, because the fourth histogram bar 908 is lower than the third histogram bar 906 (i.e., the fourth decision pattern has fewer occurrences than the third decision pattern), the fourth candidate reference voltage V3 will be incrementally lower than the third candidate reference voltage V2, as shown in FIG. 9D.

As indicated by block 836, flash memory controller 302 can maintain the (n+1)th candidate reference voltage for use in detecting data during a subsequent read. The method continues as indicated by above-described block 818 (FIG. 8A), where flash memory controller 302 determines whether one (or more) of the decision pattern counts is a minimum. As described above, the presence of a minimum indicates that one of the candidate reference voltages is optimal or as close as possible to the relevant reference voltage or cross-point. If it were determined (block 818) that one of the candidate reference voltages is optimal, then flash memory controller 302 would read data from MLC NAND flash memory device 304 using the optimal candidate reference voltage, as indicated by block 820, and the method would end, since in such an instance the method cannot adjust the candidate reference voltage any closer to the relevant reference voltage. If it is determined (block 818) that a minimal decision pattern count has not yet occurred, then the method continues as described above with regard to block 802. That is, flash memory controller 302 can perform a read retry using the (n+1)th candidate reference voltage.

Continuing with the example shown in FIGS. 9A-9F, following a read error on the third read using the third candidate reference voltage V2, flash memory controller 302, in accordance with the portion of the method described above with regard to FIGS. 8A and 8D (blocks 802-808, 818, 820 and 830-836), determines a fourth candidate reference voltage V3 and performs a fourth read using the fourth candidate reference voltage V3. Since the illustrated example implies that an error occurred on the fourth read, then flash memory controller 302 accordingly determines a fifth decision pattern. In the example shown in FIG. 9D, the fifth histogram bar 910 represents the count of the number of times the fifth decision pattern (corresponding to the voltage region between V2 and V3 occurs in the read data. Note in FIG. 9D that the candidate reference voltage has been adjusted in the direction of the downward slope of the two closed histogram bars 908 and 910 (i.e., the nth and (n+1)th histogram bars) that are adjacent the nth candidate reference voltage (which is the fourth candidate reference voltage V3 in this example).

Still continuing with the example shown in FIGS. 9A-9F, following a read error on the fourth read using the fourth candidate reference voltage V3, flash memory controller 302, in accordance with the portion of the method described above with regard to FIGS. 8A and 8D (blocks 802-808, 818, 820 and 830-836), determines a fifth candidate reference voltage V4 and performs a fifth read using the fourth candidate reference voltage V4. Since the illustrated example implies that an error occurred on the fifth read, then flash memory controller 302 accordingly determines a sixth decision pattern. In the example shown in FIG. 9E, the sixth histogram bar 912 represents the count of the number of times the sixth decision pattern (corresponding to the voltage region between V3 and V4) occurs in the read data. Note in FIG. 9E that the candidate reference voltage again has been adjusted in the direction of the downward slope of the two closed histogram bars 910 and 912 (i.e., the nth and (n+1)th histogram bars) that are adjacent the nth candidate reference voltage (which is the fifth candidate reference voltage V4 in this example).

Figure 9F:
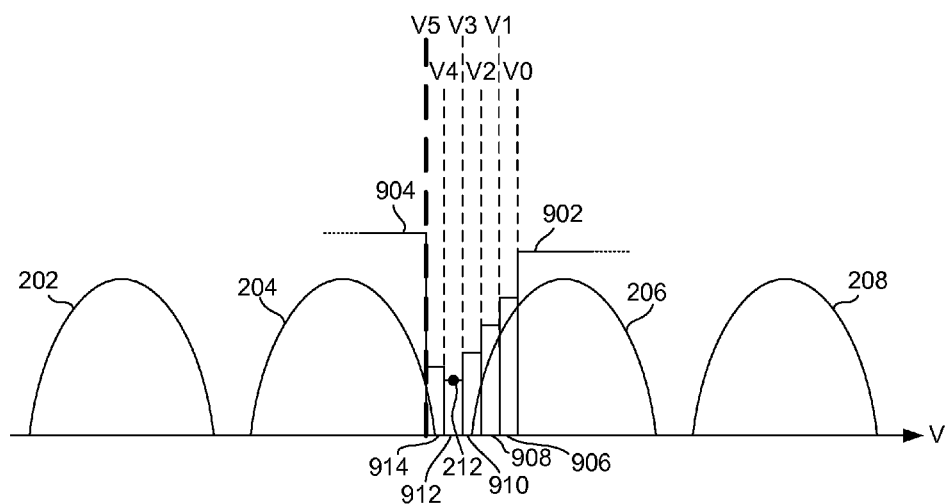
FIG. 9F is similar to FIG. 9E, further showing a sixth exemplary candidate reference voltage, two open histogram bars, and five closed histogram bars.

The example shown in FIGS. 9A-9F concludes as shown in FIG. 9F. Following a read error on the fifth read using the fifth candidate reference voltage V4, flash memory controller 302, in accordance with the portion of the method described above with regard to FIGS. 8A and 8D (blocks 802-808, 818, 820 and 830-836), determines a sixth candidate reference voltage V5. Since the illustrated example implies that an error occurred on the sixth read, then flash memory controller 302 accordingly determines a seventh decision pattern. In the example shown in FIG. 9F, the seventh histogram bar 914 represents the count of the number of times the seventh decision pattern (corresponding to the voltage region between V4 and V5) occurs in the read data. However, in the illustrated example the seventh histogram bar 914 is higher than the sixth histogram bar 912, indicating that the downwardly sloping trend of successive histogram bars has ceased. A change in the sign of the histogram slope has occurred.

Reading MLC NAND flash memory device 304 using the fifth candidate reference voltage V4 yielded the lowest or smallest histogram bar, i.e., the histogram bar representing the minimal decision pattern count. That is, histogram bar 912 is lower than histogram bars 910 and 914 on either side of histogram bar 912. Successive histogram bars on either side of histogram bar 912 define slopes of opposite signs. Thus, histogram bar 912 represents a minimum or inflection point. Since histogram bar 912 represents a minimum, flash memory controller 302 determines (block 818) that the fifth candidate reference voltage V4 is a good estimate of the optimal reference voltage. As indicated by block 820, in the illustrated example flash memory controller 302 can maintain the fifth candidate reference voltage V4 for use in reading data until such time as another read error occurs. Alternatively, flash memory controller 302 can compute the mid-point of histogram bar 912 as an estimate of the location of cross-point 212, which is presumably the optimal reference voltage, and maintain that voltage for use in reading data until such time as another read error occurs. Upon occurrence of another read error, the method described above with regard to FIGS. 8A-D is performed again.

Note in the example shown in FIGS. 9A-9F that the width of each of the closed histogram bars 906-910 is the width of the voltage regions between adjacent candidate reference voltages, i.e., the above-referenced candidate reference voltage increment. Histogram bar 902 represents the count of the number of times the decision pattern corresponding to the voltage region greater than V0 occurs in the read data. Histogram bar 904 represents the count of the number of times the decision pattern corresponding to the voltage region less than V5 occurs in the read data. Histogram bar 906 represents the count of the number of times the decision pattern corresponding to the voltage region between V0 and V1 occurs in the read data. Histogram bar 908 represents the count of the number of times the decision pattern corresponding to the voltage region between V1 and V2 occurs in the read data. Histogram bar 910 represents the count of the number of times the decision pattern corresponding to the voltage region between V2 and V3 occurs in the read data. Histogram bar 912 represents the count of the number of times the decision pattern corresponding to the voltage region between V3 and V4 occurs in the read data. Histogram bar 914 represents the count of the number of times the decision pattern corresponding to the voltage region between V4 and V5 occurs in the read data.

Note that a candidate reference voltage that is determined to be optimal corresponds to one of cross-points 210-214 in FIG. 2. The lowest or minimum decision pattern count (or counts if two or more counts are equally the lowest) serves as an indicator of the location of a cross-point. Correspondingly, the shortest histogram bar (or histogram bars if two or more are equally the shortest) serves as an indicator of the location of a cross-point. Thus, in the example shown in FIG. 9F, histogram bar 912 serves as an indicator of the location of cross-point 212. In an instance such as that shown in FIG. 9F in which there is one histogram bar that is shorter than all others, flash memory controller 302 can compute its midpoint as an estimate of the location of the cross-point. In an instance (not shown) in which two or more histogram bars are equally the shortest, the cross-point can be estimated to lie at their mid-point.

The method is described above with regard to an example in which the location of cross-point 212, which is relevant to detecting the LSB read from a cell of MLC NAND flash memory device 304, is determined. Persons skilled in the art understand that essentially the same method can be used to determine the locations of cross-points 210 and 214, which are relevant to detecting the MSB read from a cell of MLC NAND flash memory device 304. The method is not described in similar detail with regard to an example involving cross-points 210 and 214, as persons skilled in the art are readily capable of providing a suitable method and flash memory controller or similar system to effect such a method in view of the description above. Nevertheless, the following example described with regard to FIG. 10 may be useful. For purposes of clarity, in the following example only three different candidate reference voltages are shown. However, more generally, any number of different candidate reference voltages can be used on successive read retries as described above.

Figure 10:
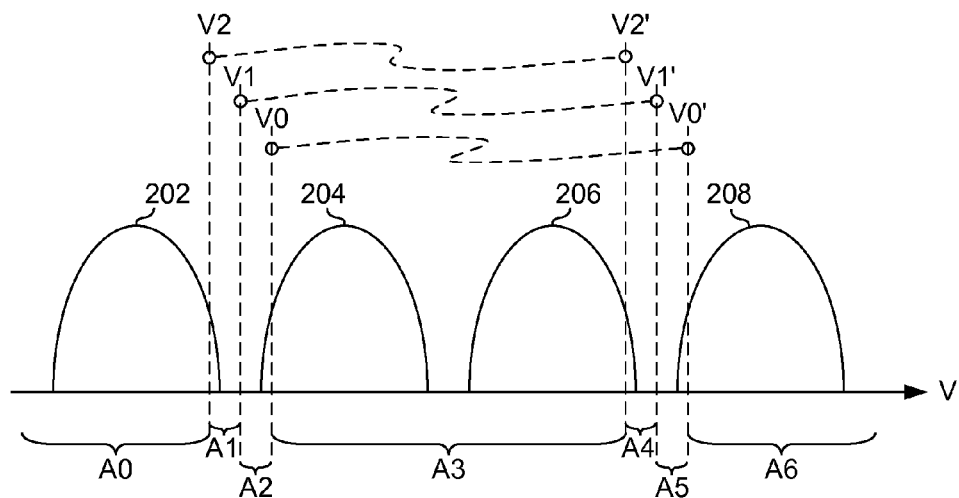
FIG. 10 is a plot of flash memory cell voltage distributions showing an example in which three candidate reference voltages are used in relation to two cell voltage distribution cross-points associated with an MSB of a memory cell.

As illustrated in FIG. 10, voltage windows A0, A1, A2, A3, A4, A5 and A6, which relate to above-described cross-points 210 and 214 (not shown in FIG. 10 because the method has not yet determined their location), serve as criteria for detecting the MSB stored in a cell. Each cell is read three times in this example. In successive read retries, a first pair of candidate reference voltages V0 and V0' are used to read a cell, a second pair of candidate reference voltages V1 and V1' are used to read the same cell, and a third pair of candidate reference voltages V2 and V2' are also used to read the same cell. Note that the first voltage in each pair relates to cross-point 210, and the second voltage (denoted by the prime symbol) relates to cross-point 214. The second voltage in each pair can be greater than the first voltage by a fixed amount or increment. For the ordered set of seven decision regions {A0, A1, A2, A3, A4, A5 and A6} there is an ordered set of seven corresponding three-bit decision patterns {111, 011, 001, 000, 100, 110, 111}. Note that since Gray coding is used, the same decision pattern that corresponds to decision region A0 also corresponds to decision region A6. The leftmost bit in each three-bit decision pattern corresponds to the use of the first candidate reference voltage V0, the middle bit in each three-bit decision pattern corresponds to the use of the second candidate reference voltage V1, and the rightmost bit in each three-bit decision pattern corresponds to the use of the third candidate reference voltage V2. As in the examples described above, in this example each decision pattern corresponds to a voltage region bordering one of the candidate reference voltages. The corresponding histograms are not shown in FIG. 10 for purposes of clarity.

The same method described above with regard to FIGS. 8A-D can be used to determine cross-points 210 and 214. That is, if flash memory controller 302 determines that a read error occurred, then flash memory controller 302 uses the read data to determine decision patterns. Flash memory controller 302 then counts the number of times each decision pattern occurs in the read data and uses the counts to determine a new candidate reference voltage for use in a read retry.

Figure 11:
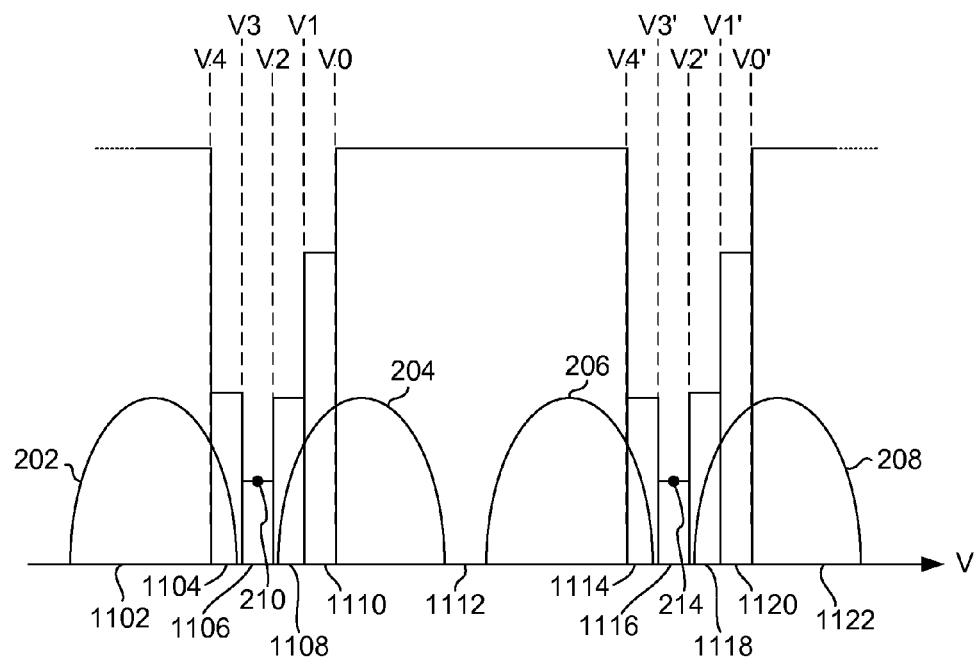
FIG. 11 is a plot of flash memory cell voltage distributions and exemplary histogram bars used in the exemplary method in relation to determining two cell voltage distribution cross-points associated with an MSB of a memory cell.

Although histograms are not shown in FIG. 10 for purposes of clarity, another example is shown in FIG. 11 in which eleven histogram bars 1102, 1104, 1106, 1108, 1110, 1112, 1114, 1116, 1118, 1120 and 1122 are shown as conceptually corresponding to eleven voltage regions (and thus ten decision patterns). Accordingly, the example shown in FIG. 11 relates to an instance in which five pairs of candidate reference voltages, V0 and V0', V1 and V1', V2 and V2', V3 and V3', and V4 and V4', are used in successive read retries.

As described above, flash memory controller 302 can use the counts (i.e., decision pattern frequency) to adjust the candidate reference voltages to cross-points 210 and 214. In the example shown in FIG. 11, two counts, represented by histogram bars 1106 and 1116, respectively, are lower than the other counts. Therefore, these counts serve as indicators of the locations of cross-points 210 and 214, respectively. Flash memory controller 302 can compute the midpoints of histogram bars 1106 and 1116 as estimates of the locations of cross-points 210 and 214, respectively.

It should be understood that the flow diagrams of FIGS. 7 and 8A-D are intended only to be exemplary or illustrative of the logic underlying the above-described method. In view of the descriptions herein, persons skilled in the art readily will be capable of programming or configuring a flash memory controller or similar system in any of various ways to effect the above-described method and similar methods. Blocks 702-716 and 802-836 are intended only as examples, and in other embodiments the steps or acts described above with regard to blocks 702-716 and 802-836 and similar steps or acts can occur in any other suitable order or sequence. Steps or acts described above with regard to blocks 702-716 and 802-836 and similar steps or acts can be combined with others or omitted in some embodiments. Similarly, logic elements 316-326 (FIG. 3) are intended only as examples, and the logic underlying the above-described method can be modularized in any other suitable manner. In view of the descriptions herein, persons skilled in the art will readily be capable of programming or configuring flash memory controller 302 with suitable software or in suitable logic, such as in the form of an application-specific integrated circuit (ASIC) or similar device or combination of devices, to effect the above-described method and similar methods. Also, it should be understood that the combination of software instructions or similar logic and the memory in which such software instructions or similar logic is stored or embodied for execution in processing system 306, comprises a "computer-readable medium" or "computer program product" as that term is used in the patent lexicon.

It should be noted that the invention has been described with reference to one or more exemplary embodiments for the purpose of demonstrating the principles and concepts of the invention. The invention is not limited to these embodiments. For example, although the above-described exemplary embodiment relates to MLC NAND flash memory, other embodiments can relate to SLC, TLC or any other suitable type of flash memory. As will be understood by persons skilled in the art, in view of the description provided herein, many variations may be made to the embodiments described herein and all such variations are within the scope of the invention.

What is claimed is:

1. A method for operation of a flash memory controller, comprising:

reading data from a portion of a flash memory using a candidate reference voltage;

determining whether a read error occurred;

determining a plurality of decision patterns if it is determined a read error occurred, each decision pattern corresponding to a voltage region bordering the candidate reference voltage;

counting occurrences of each decision pattern of the plurality of decision patterns in the data read from the portion of the flash memory;

determining a new candidate reference voltage in response to frequency of the occurrences of each decision pattern; and using the new candidate reference voltage in repeating the step of reading data from a portion of a flash memory.

2. The method of claim 1, wherein:

the step of reading data from a portion of a flash memory using a candidate reference voltage includes initially reading data a first time from a portion of a flash memory using a first candidate reference voltage;

the step of determining whether a read error occurred includes determining whether a read error occurred the first time;

the step of determining a plurality of decision patterns includes determining first and second decision patterns, each of the first and second decision patterns corresponding to a voltage region bordering the first candidate reference voltage;

the step of counting occurrences of each decision pattern includes counting occurrences of each of the first and second decision patterns in the data read from the portion of the flash memory; and the step of determining a new candidate reference voltage in response to frequency of the occurrences of each decision pattern includes determining a second candidate reference voltage by determining one of the first and second decision patterns having more occurrences than the other of the first and second decision patterns, wherein the second candidate reference voltage is incrementally lower than the first candidate reference voltage if the one of the first and second decision patterns having more occurrences than the other of the first and second decision patterns corresponds to a lower voltage region than the other of the first and second decision patterns, wherein the second candidate reference voltage is incrementally higher than the first candidate reference voltage if the one of the first and second decision patterns having more occurrences than the other of the first and second decision patterns corresponds to a higher voltage region than the other.

3. The method of claim 2, wherein:

if it is determined a read error occurred the first time, then the step of reading data from a portion of a flash memory using a candidate reference voltage further includes reading data a second time using the second candidate reference voltage;

the step of determining whether a read error occurred includes determining whether a read error occurred the second time;

if it is determined a read error occurred the second time, then the step of determining a plurality of decision patterns includes determining a third decision pattern corresponding to a voltage region bordering the second candidate reference voltage;

the step of counting occurrences of each decision pattern includes counting occurrences of the third decision pattern in the data read from the portion of the flash memory; and the step of determining a new candidate reference voltage in response to frequency of the occurrences of each decision pattern includes determining a third candidate reference voltage by determining one of the first and second decision patterns having more occurrences than the other of the first and second decision patterns, wherein the third candidate reference voltage is incrementally lower than the first candidate reference voltage if the one of the first and second decision patterns having more occurrences than the other of the first and second decision patterns corresponds to a lower voltage region than the other of the first and second decision patterns, wherein the third candidate reference voltage is incrementally higher than the first candidate reference voltage if the one of the first and second decision patterns having more occurrences than the other of the first and second decision patterns corresponds to a higher voltage region than the other.

4. The method of claim 3, wherein:

if it is determined a read error occurred the second time, then the step of reading data from a portion of a flash memory using a candidate reference voltage further includes reading data one or more additional times and determining each time whether a read error occurred and further includes reading data an nth time using an nth candidate reference voltage different from all other candidate reference voltages, wherein n is an integer greater than two;

the step of determining whether a read error occurred includes determining whether a read error occurred the nth time;

if it is determined a read error occurred the nth time, then the step of determining a plurality of decision patterns includes determining an (n+1)th decision pattern corresponding to a voltage region bordering the nth candidate reference voltage;

the step of counting occurrences of each decision pattern includes counting occurrences of the (n+1)th decision pattern in the data read from the portion of the flash memory; and the step of determining a new candidate reference voltage in response to frequency of the occurrences of each decision pattern includes determining an (n+1)th candidate reference voltage by determining one of the nth and (n+1)th decision patterns having fewer occurrences than the other of the nth and (n+1)th decision patterns, wherein the (n+1)th candidate reference voltage is incrementally lower than the nth candidate reference voltage if the one of the nth and (n+1)th decision patterns having fewer occurrences than the other of the nth and (n+1)th decision patterns corresponds to a lower voltage region than the other of the nth and (n+1)th decision patterns, wherein the (n+1)th candidate reference voltage is incrementally higher than the nth candidate reference voltage if the one of the nth and (n+1)th decision patterns having fewer occurrences than the other of the nth and (n+1)th decision patterns corresponds to a higher voltage region than the other.

5. The method of claim 4, wherein data is not read from the portion of the flash memory an (n+1)th time if it is determined that no read error occurred the nth time.

6. The method of claim 4, wherein data is not read from the portion of the flash memory more than one additional time if it is determined that the nth decision pattern has fewer occurrences than the (n+1)th decision pattern and the nth decision pattern has fewer occurrences than an (n+1)th decision pattern.

7. The method of claim 1, wherein the flash memory is a multi-level cell (MLC) flash memory.

8. A flash memory controller, comprising:
a buffer memory; and
a processing system comprising:
read logic for reading data from a portion of a flash memory using a candidate reference voltage;
read retry logic for determining whether a read error occurred;
decision pattern logic for determining a plurality of decision patterns if it is determined a read error occurred, each decision pattern corresponding to a voltage region bordering the candidate reference voltage;
histogram logic for counting occurrences of each decision pattern of the plurality of decision patterns in the data read from the portion of the flash memory;
reference voltage adjustment logic for determining a new candidate reference voltage in response to frequency of the occurrences of each decision pattern; and
detection logic for using the new candidate reference voltage in again reading data from a portion of a flash memory.

9. The flash memory controller of claim 8, wherein:
the read logic initially reads data a first time from a portion of a flash memory using a first candidate reference voltage;
the read retry logic determines whether a read error occurred the first time;
the decision pattern logic determines first and second decision patterns, each of the first and second decision patterns corresponding to a voltage region bordering the first candidate reference voltage;
the histogram logic counts occurrences of each of the first and second decision patterns in the data read from the portion of the flash memory; and
the reference voltage adjustment logic determines a second candidate reference voltage by determining one of the first and second decision patterns having more occurrences than the other of the first and second decision patterns, wherein the second candidate reference voltage is incrementally lower than the first candidate reference voltage if the one of the first and second decision patterns having more occurrences than the other of the first and second decision patterns corresponds to a lower voltage region than the other of the first and second decision patterns, wherein the second candidate reference voltage is incrementally higher than the first candidate reference voltage if the one of the first and second decision patterns having more occurrences than the other of the first and second decision patterns corresponds to a higher voltage region than the other.

10. The flash memory controller of claim 9, wherein:
if it is determined a read error occurred the first time, then the read logic reads data a second time using the second candidate reference voltage;
the read retry logic determines whether a read error occurred the second time;

if it is determined a read error occurred the second time, then the decision pattern logic determines a third decision pattern corresponding to a voltage region bordering the second candidate reference voltage;
the histogram logic counts occurrences of the third decision pattern in the data read from the portion of the flash memory; and
the reference voltage adjustment logic determines a third candidate reference voltage by determining one of the first and second decision patterns having more occurrences than the other of the first and second decision patterns, wherein the third candidate reference voltage is incrementally lower than the first candidate reference voltage if the one of the first and second decision patterns having more occurrences than the other of the first and second decision patterns corresponds to a lower voltage region than the other of the first and second decision patterns, wherein the third candidate reference voltage is incrementally higher than the first candidate reference voltage if the one of the first and second decision patterns having more occurrences than the other of the first and second decision patterns corresponds to a higher voltage region than the other.

11. The flash memory controller of claim 10, wherein:
the read logic reads data one or more additional times and determining each time whether a read error occurred and further includes reading data an nth time using an nth candidate reference voltage different from all other candidate reference voltages, wherein n is an integer greater than two;
the read retry logic determines whether a read error occurred the nth time;
the decision pattern logic determines an (n+1)th decision pattern corresponding to a voltage region bordering the nth candidate reference voltage;
the histogram logic counts occurrences of the (n+1)th decision pattern in the data read from the portion of the flash memory; and
the reference voltage adjustment logic determines an (n+1)th candidate reference voltage by determining one of the nth and (n+1)th decision patterns having fewer occurrences than the other of the nth and (n+1)th decision patterns, wherein the (n+1)th candidate reference voltage is incrementally lower than the nth candidate reference voltage if the one of the nth and (n+1)th decision patterns having fewer occurrences than the other of the nth and (n+1)th decision patterns corresponds to a lower voltage region than the other of the nth and (n+1)th decision patterns, wherein the (n+1)th candidate reference voltage is incrementally higher than the nth candidate reference voltage if the one of the nth and (n+1)th decision patterns having fewer occurrences than the other of the nth and (n+1)th decision patterns corresponds to a higher voltage region than the other.

12. The flash memory controller of claim 11, wherein the data is not read from the portion of the flash memory an (n+1)th time if it is determined that no read error occurred the nth time.

13. The flash memory controller of claim 11, wherein data is not read from the portion of the flash memory more than one additional time if it is determined that the nth decision pattern has fewer occurrences than the (n+1)th decision pattern and the nth decision pattern has fewer occurrences than an (n11)th decision pattern.

14. The flash memory controller of claim 8, wherein the flash memory is a multi-level cell (MLC) flash memory.

15. A computer program product for operation of a flash memory controller, the computer program product comprising a computer-readable medium having stored therein in computer-executable non-transitory form instructions that, when executed on a processing system of a flash memory controller, cause the processing system to effect a method comprising:
reading data from a portion of a flash memory using a candidate reference voltage;
determining whether a read error occurred;
determining a plurality of decision patterns if it is determined a read error occurred, each decision pattern corresponding to a voltage region bordering the candidate reference voltage;
counting occurrences of each decision pattern of the plurality of decision patterns in the data read from the portion of the flash memory;
determining a new candidate reference voltage in response to frequency of the occurrences of each decision pattern; and
using the new candidate reference voltage in repeating the step of reading data from a portion of a flash memory.

16. The computer program product of claim 15, wherein:
the step of reading data from a portion of a flash memory using a candidate reference voltage includes initially reading data a first time from a portion of a flash memory using a first candidate reference voltage;
the step of determining whether a read error occurred includes determining whether a read error occurred the first time;
the step of determining a plurality of decision patterns includes determining first and second decision patterns, each of the first and second decision patterns corresponding to a voltage region bordering the first candidate reference voltage;
the step of counting occurrences of each decision pattern includes counting occurrences of each of the first and second decision patterns in the data read from the portion of the flash memory; and
the step of determining a new candidate reference voltage in response to frequency of the occurrences of each decision pattern includes determining a second candidate reference voltage by determining one of the first and second decision patterns having more occurrences than the other of the first and second decision patterns, wherein the second candidate reference voltage is incrementally lower than the first candidate reference voltage if the one of the first and second decision patterns having more occurrences than the other of the first and second decision patterns corresponds to a lower voltage region than the other of the first and second decision patterns, wherein the second candidate reference voltage is incrementally higher than the first candidate reference voltage if the one of the first and second decision patterns having more occurrences than the other of the first and second decision patterns corresponds to a higher voltage region than the other.

17. The computer program product of claim 16, wherein:
if it is determined a read error occurred the first time, then the step of reading data from a portion of a flash memory using a candidate reference voltage further includes reading data a second time using the second candidate reference voltage;
the step of determining whether a read error occurred includes determining whether a read error occurred the second time;

if it is determined a read error occurred the second time, then the step of determining a plurality of decision patterns includes determining a third decision pattern corresponding to a voltage region bordering the second candidate reference voltage;

the step of counting occurrences of each decision pattern includes counting occurrences of the third decision pattern in the data read from the portion of the flash memory; and the step of determining a new candidate reference voltage in response to frequency of the occurrences of each decision pattern includes determining a third candidate reference voltage by determining one of the first and second decision patterns having more occurrences than the other of the first and second decision patterns, wherein the third candidate reference voltage is incrementally lower than the first candidate reference voltage if the one of the first and second decision patterns having more occurrences than the other of the first and second decision patterns corresponds to a lower voltage region than the other of the first and second decision patterns, wherein the third candidate reference voltage is incrementally higher than the first candidate reference voltage if the one of the first and second decision patterns having more occurrences than the other of the first and second decision patterns corresponds to a higher voltage region than the other.

18. The computer program product of claim 17, wherein:

if it is determined a read error occurred the second time, then the step of reading data from a portion of a flash memory using a candidate reference voltage further includes reading data one or more additional times and determining each time whether a read error occurred and further includes reading data an nth time using an nth candidate reference voltage different from all other candidate reference voltages, wherein n is an integer greater than two;

the step of determining whether a read error occurred includes determining whether a read error occurred the nth time;

if it is determined a read error occurred the nth time, then the step of determining a plurality of decision patterns includes determining an (n+1)th decision pattern corresponding to a voltage region bordering the nth candidate reference voltage;

the step of counting occurrences of each decision pattern includes counting occurrences of the (n+1)th decision pattern in the data read from the portion of the flash memory; and the step of determining a new candidate reference voltage in response to frequency of the occurrences of each decision pattern includes determining an (n+1)th candidate reference voltage by determining one of the nth and (n+1)th decision patterns having fewer occurrences than the other of the nth and (n+1)th decision patterns, wherein the (n+1)th candidate reference voltage is incrementally lower than the nth candidate reference voltage if the one of the nth and (n+1)th decision patterns having fewer occurrences than the other of the nth and (n+1)th decision patterns corresponds to a lower voltage region than the other of the nth and (n+1)th decision patterns, wherein the (n+1)th candidate reference voltage is incrementally higher than the nth candidate reference voltage if the one of the nth and (n+1)th decision patterns having fewer occurrences than the other of the nth and (n+1)th decision patterns corresponds to a higher voltage region than the other.

19. The computer program product of claim 18, wherein data is not read from the portion of the flash memory an (n+1)th time if it is determined that no read error occurred the nth time.

20. The computer program product of claim 18, wherein data is not read from the portion of the flash memory more than one additional time if it is determined that the nth decision pattern has fewer occurrences than the (n+1)th decision pattern and the nth decision pattern has fewer occurrences than an (n11)th decision pattern.

* * * * *